(12) United States Patent
Rytkönen

(10) Patent No.: US 10,429,406 B2
(45) Date of Patent: Oct. 1, 2019

(54) MICROELECTROMECHANICAL STRUCTURE WITH FRAMES

(71) Applicant: MURATA MANUFACTURING CO., LTD., Nagaokakyo-shi, Kyoto (JP)

(72) Inventor: Ville Pekka Rytkönen, Klaukkala (FI)

(73) Assignee: MURATA MANUFACTURING CO., LTD., Nagaokakyo-shi, Kyoto (JP)

( * ) Notice: Subject to any disclaimer, the term of this patent is extended or adjusted under 35 U.S.C. 154(b) by 105 days.

(21) Appl. No.: 14/630,780

(22) Filed: Feb. 25, 2015

(65) Prior Publication Data

US 2015/0241467 A1 Aug. 27, 2015

(30) Foreign Application Priority Data

Feb. 26, 2014 (FI) .................................. 20145186

(51) Int. Cl.
*G01P 15/125* (2006.01)
*B81B 3/00* (2006.01)
*B81B 7/00* (2006.01)
*G01P 15/08* (2006.01)

(52) U.S. Cl.
CPC .......... *G01P 15/125* (2013.01); *B81B 3/0051* (2013.01); *B81B 3/0086* (2013.01); *B81B 7/0022* (2013.01); *B81B 2203/051* (2013.01); *G01P 2015/0814* (2013.01); *G01P 2015/0871* (2013.01)

(58) Field of Classification Search
CPC ... B81B 3/0051; B81B 3/0086; B81B 7/0022; B81B 2203/051; G01P 15/125; G01P 2015/0814; G01P 2015/0871
USPC ...................................................... 73/514.32
See application file for complete search history.

(56) References Cited

U.S. PATENT DOCUMENTS

| 6,308,569 | B1 | 10/2001 | Stewart |
| 2003/0227700 | A1 | 12/2003 | Mizuno et al. |
| 2010/0242600 | A1 | 9/2010 | Lin et al. |
| 2011/0219875 | A1 | 9/2011 | Walther et al. |
| 2012/0055249 | A1 | 3/2012 | Miyatake et al. |
| 2012/0216616 | A1 | 8/2012 | Schultz |
| 2012/0223726 | A1 | 9/2012 | Zhang et al. |

(Continued)

FOREIGN PATENT DOCUMENTS

| JP | 2003-075158 A | 3/2003 |
| JP | 2011-047668 A | 3/2011 |

(Continued)

OTHER PUBLICATIONS

Finnish Search Report dated Oct. 17, 2014 corresponding to Finnish Patent Application No. 20145186.

(Continued)

*Primary Examiner* — Peter J Macchiarolo
*Assistant Examiner* — Irving A Campbell
(74) *Attorney, Agent, or Firm* — Squire Patton Boggs (US) LLP

(57) ABSTRACT

A robust microelectromechanical structure that is less prone to internal or external electrical disturbances. The structure includes a mobile element with a rotor suspended to a support, a first frame anchored to the support and circumscribing the mobile element, and a second frame anchored to the support and circumscribing the mobile element between the mobile element and the first frame, electrically isolated from the first frame. The rotor and the second frame are galvanically coupled to have a same electric potential.

11 Claims, 3 Drawing Sheets

(56) References Cited

U.S. PATENT DOCUMENTS

| | | |
|---|---|---|
| 2012/0280591 A1 | 11/2012 | Schultz |
| 2013/0019678 A1 | 1/2013 | Lazaroff et al. |
| 2013/0111992 A1 | 5/2013 | O'Brien |
| 2013/0192370 A1 | 8/2013 | Yoda |
| 2013/0299923 A1 | 11/2013 | Classen et al. |
| 2015/0143906 A1 | 5/2015 | Ogawa |

FOREIGN PATENT DOCUMENTS

| | | |
|---|---|---|
| JP | 2011191304 A | 9/2011 |
| JP | 2012-502276 A | 1/2012 |
| JP | 2013-217835 A | 10/2013 |
| JP | 2013217844 A | 10/2013 |
| WO | 2007/120576 A2 | 10/2007 |
| WO | 2011/016859 A2 | 2/2011 |

OTHER PUBLICATIONS

Finnish Search Report dated Oct. 15, 2014 corresponding to Finnish Patent Application No. 20145185.
Finnish Search Report dated Oct. 14, 2014 corresponding to Finnish Patent Application No. 20145184.
International Search Report application No. PCT/IB2015/051417 dated May 21, 2015.
U.S. Office Action U.S. Appl. No. 14/630,801 dated Dec. 3, 2015.
English Language Translation of Japanese Office Action dated Jun. 13, 2017, issued in corresponding JP Application No. 554176/2016.

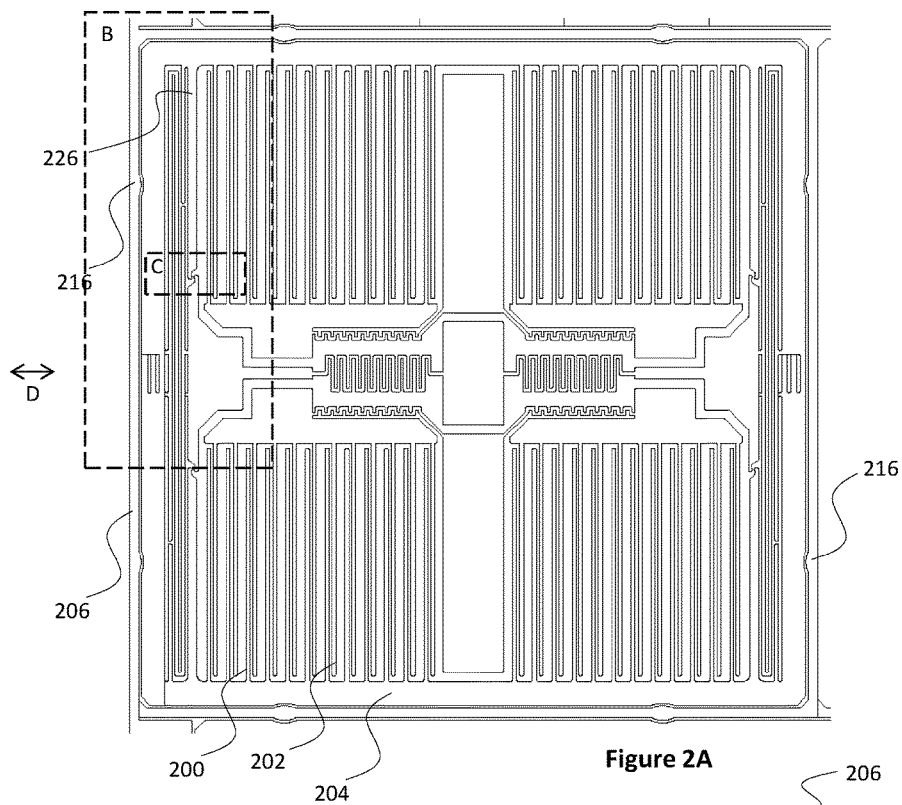
Figure 2A
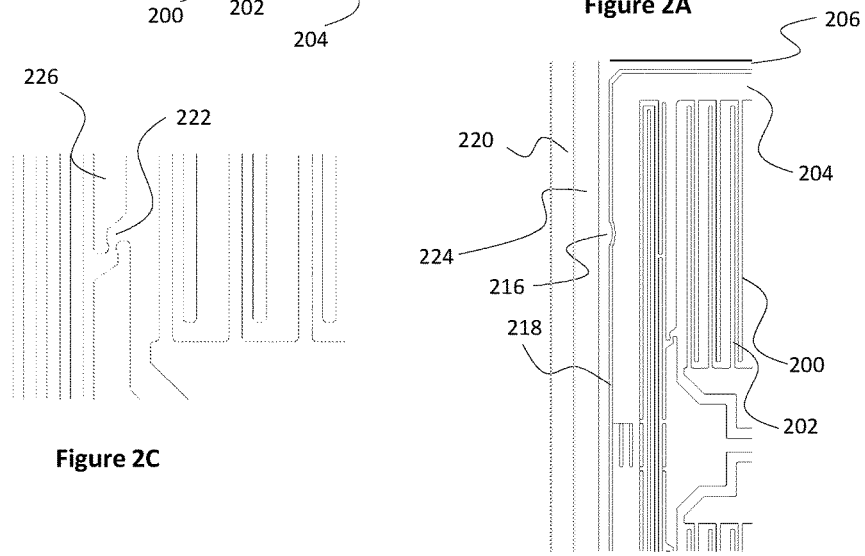
Figure 2C
Figure 2B

MICROELECTROMECHANICAL STRUCTURE WITH FRAMES

BACKGROUND

Field

The present invention relates to microelectromechanical devices and especially to a microelectromechanical structure and a microelectromechanical device, as defined in the preambles of the independent claims.

Description of the Related Art

Microelectromechanical systems, or MEMS can be defined as miniaturized microsystems where at least some elements have a mechanical functionality. MEMS structures can be applied to quickly and accurately detect very small changes in physical properties.

The micron-scale dimensions of MEMS incorporate more devices on a silicon wafer and thereby have opened up a broad range of new applications in lower cost. However, the minimal sizing creates also challenges to the implementations. For example, displacements of mechanical functions in a MEMS structure are often induced, controlled and/or detected by electrical components. It is understood that in the miniaturized dimensions, internal electromagnetic or electrostatic fields by the electrical components may unintentionally interact with each other and cause errors to the measurements. The induction, control and detection of the mechanical functions may also be disturbed by external electromagnetic or electrostatic fields.

SUMMARY

An object of the present invention is to provide a microelectromechanical device structure that enables accurate measurements in a minimized size. This and other objects of the present invention are achieved with a microelectromechanical structure, and a microelectromechanical device according to the claims.

The claims define a robust microelectromechanical structure that is less prone to internal or external electrical disturbances. The structure comprises a mobile element with a rotor suspended to a support, a first frame anchored to the support and circumscribing the mobile element, and a second frame anchored to the support and circumscribing the mobile element between the mobile element and the first frame, electrically isolated from the first frame. The rotor and the second frame are galvanically coupled to have a same electric potential.

The claims define also a micromechanical device that includes the microelectromechanical structure.

Further advantages of the invention are discussed in more detail with the following embodiments.

BRIEF DESCRIPTION OF THE DRAWINGS

In the following the invention will be described in greater detail, in connection with preferred embodiments, with reference to the attached drawings, in which FIG. 1 illustrate elements of a microelectromechanical structure;

FIG. 2A illustrates an exemplary configuration for a mobile element and a shield frame;

FIG. 2B shows an enlarged section B marked in FIG. 2A, together with a section of an associated element frame;

FIG. 2C shows an enlarged section C marked in FIG. 2A;

DETAILED DESCRIPTION

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a device architecture in which various embodiments of the invention may be implemented. Only elements relevant for illustrating the embodiments are described in detail. Various implementations of microelectromechanical structures that are generally known to a person skilled in the art may not be specifically described herein.

Figure 1:
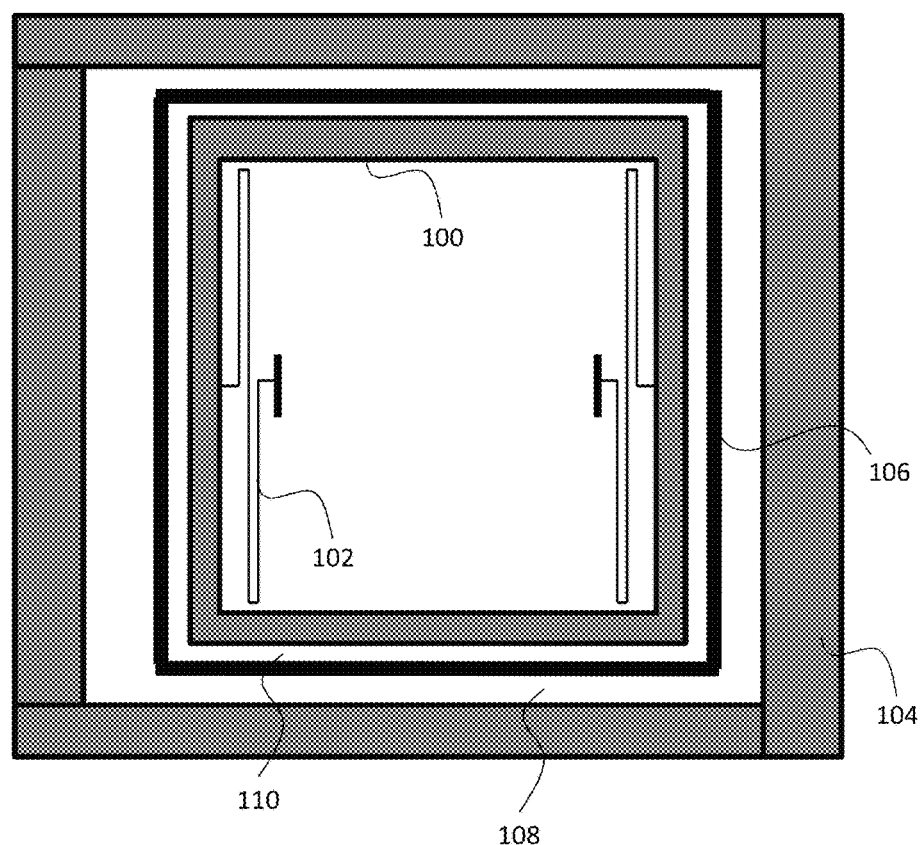

As an example of microelectromechanical structures, FIG. 1 shows a section of a microelectromechanical structure applicable for inertial sensing. In order to create mechanical energy to be transformed into signals, and vice versa, a microelectromechanical structure may be patterned to include at least one mobile element 100. A mobile element 100 refers here to a structural entity that has a rotor, a non-zero mass, which is suspended to a support by means of a suspension spring structure 102, and may move in respect of the support. The support structure may be provided by another body element of a microelectromechanical device, for example, by an underlying handle wafer, or a covering cap wafer, provided separately or in combination from a layered silicon-on-insulator substrate.

The rotor of the mobile element 100 may be suspended to the support through a suspension spring structure 102 that is flexible to displacements of the seismic mass of the mobile element in at least one direction, and very rigid to displacements of the seismic mass in other directions. The suspension spring structure 102 may be configured to allow, in normal conditions, movement of the rotor in a designed direction and within defined structural design limits, and resist movement of the mobile element in other directions.

The motion of the mobile element may be induced or detected, for example, capacitively. For this, the mobile element 100 may include a stator. The term stator refers here to a part of the mobile element that is anchored to the support to form one or more stationary electrodes for one or more mobile electrodes of the rotor. Pairs of stationary and mobile electrodes form capacitors, and capacitive sensing relies on an external physical parameter changing the capacitance of the capacitors. This may take place by changing the separation or the area of overlap between the capacitor electrodes. When a constant voltage is applied over the capacitor, the change in capacitance, and thus the motion of the rotor, may be measured, for example, with a bridge circuit.

The microelectromechanical structure is advantageously a layer element that includes components patterned to extend in-plane along the layer by removing sacrificial material from the layer. The microelectromechanical structure may include a first frame, herein called as an element frame 104. The term frame refers is here a circumferential structure that may be anchored to the support and circumscribes the mobile element 100. It is understood that the frame does not necessarily have a continuous form. Accordingly, the element frame 104 may be a single peripheral structure, or include one or more frame subsections arranged jointly to form a peripheral borderline around the mobile element 100. It is understood that the element frame 104 may circumscribe also other elements. For example, the layer element may include one or more mobile elements for detecting motions in different axes (perpendicular directions), and the element frame 104 peripherally surrounds all those mobile elements. The element frame 104 provides mechanical protection and/or enables hermetical sealing for the internal mobile element. At the same time it provides a conductive enclosure that isolates the mobile element from external electrical disturbances. The element frame 104 may be connected to a constant voltage V1, preferably to ground GND.

The microelectromechanical structure may also include a second frame, herein called as a shield frame 106. Also the shield frame 106 circumscribes the mobile element 100, but it is positioned between the frame element 104 and the mobile element 100. If the layer element includes one or more mobile elements, advantageously each mobile element is circumscribed by a dedicated shield frame. A circumscribing element is separated from a circumscribed element or circumscribed elements by at least one element gap. In a neutral state, a first gap 108 of FIG. 1 separates the element frame 104 from the shield frame 106 and a second gap 110 separates the shield frame 106 from the mobile element 100. The shield frame 106 and the rotor of the mobile element 100 have a galvanic contact (i.e. are electrically connected by means of conductive material) that connects them to a same constant voltage V2, but the first gap 108 electrically insulates the shield frame 106 from the element frame 104.

During operation, electrical control circuitry is typically adapted to keep voltage V1 fed to the element frame and V2 to the rotor the same. However, for internal capacitor voltages and external disturbances, this is not fully achieved, and some potential difference tends to exist between the element frame and the rotor. The shield frame 106 effectively minimizes errors caused by random potential errors between V1 and V2.

In special situations, the rotor of the mobile element 100 may be displaced beyond the design limits. For these situations, the microelectromechanical structure may comprise motion limiters. Their task is to mechanically control the maximum distance that the rotor can displace, and/or dissipate energy in a controlled way when the design limits are exceeded. In conventional structures, motion limiters are typically between the element frame and the rotor. However, due to the potential difference, a contact between the rotor and the element frame short circuits the elements, resulting in sticking and/or errors in rotor capacitance.

In the present structure, the potential difference between the rotor and the neighboring element is zero, and potential contact between them does not cause said adverse effects. Specifically, in a conventional mufti-axis sensor where a common rotor potential is applied in detection, a contact caused by an external shock means loss of signal is all directions, i.e. for all detected axes. In the present embodiment, a contact may occur in a direction of one axis, but the rotor potential is unaffected by it. The shield frame thus separates detection axes from each other such that a shock and loss of signal in the direction of one detection axis does not directly cause error to detection in the direction of other detection axes. Motion limiter structures can therefore be safely arranged to the shield frame 106. Advantageously, but not necessarily, the motion limiter structures are flexible to reduce the risk of breaking of structural elements that contact at impact.

Advantageously, the shield frame 106 is arranged to be close to the mobile element 100. It is known that a narrow gap formed by two surfaces restricts the displacement of gas perpendicular to the surfaces. When motion of the surfaces squeezes the gap, the gas pressure increases, which decelerates the motion. The closer the surfaces are, the more efficiently the motion is decelerated. In conventional applications, comb structures of the mobile element typically include in at least one direction a distance that enables applicable gas damping. In other directions gas damping is not effective.

Consequently, in a micro-scale accelerometer that applies capacitive comb structures, the width of the second gap 110 is advantageously of the order of the width of the comb gaps. In a neutral state where the position of the rotor in respect of the stator depends on the suspension spring structure, the comb gap can be considered to correspond to the distance between parallel and adjacent stator and rotor comb bars. The width of the second gap 110 is advantageously 0.5 to 5 times such a comb cap. The shield electrode 106 allows provision of a very narrow second gap and thus very efficient gas damping for the rotor of the mobile element 100 in all directions. The element frame 104 and specifically the second gap, on the other hand, may be freely dimensioned according to other operational parameters or manufacturing requirements.

FIG. 2A illustrates an exemplary configuration for a mobile element and a shield frame. FIG. 2B shows an enlarged section marked in FIG. 2A, together with a section of an associated element frame. As may be seen from FIGS. 2A to 2C, the microelectromechanical structure may include a mobile element implemented as a comb structure with mobile rotor combs 200 and stator combs 202. The mobile rotor combs 200 may extend inwards from a rotor frame 204. The rotor frame 204 may be circumscribed by an anchored shield frame 206, and the shield frame 206 by an anchored element frame 220. The first gap 224 is then the element gap between the element frame 220, and the second gap 218 is the element gap between the shield frame 206 and the rotor frame 204. The rotor frame 204 may have a degree in freedom in the first direction D.

The exemplary mobile element of FIGS. 2A to 2C includes an impact element 226 for a first motion limiter stage within the mobile element. The first motion limiter stage may be implemented with a combination of beams, one of which is coupled to an anchor and the other of which is coupled to the rotor frame 204. Lateral ends of the beams are separated in direction D by a first limiter gap 222 that is narrower than the second gap 218 between the mobile element and the rotor frame 204. At some point, when the motion of the rotor frame 204 in direction D increases, the first limiter gap 222 closes, the beam ends come into contact and limit the motion.

The exemplary mobile element of FIGS. 2A to 2C includes also a second motion limiter stage between the mobile element and the shield frame. As shown, as second impact elements, the anchored shield frame 206 may include one or more frame protrusions 216 separated from the rotor frame 204 by a second gap 218. To enable correct order of contact, the extent of the second gap 218 in direction D is greater than extent of the first limiter gap 222, i.e. the distance between the lateral ends of the beams of the first motion limiter stage in direction D.

Thus, in cases of minor deviations from the design limits, the rotor frame 204 may move in direction D, whereupon the first beams get into contact with each other and resiliently oppose the excessive motion. Due to an optimized form of the contacting surfaces of the beams, the adhesive force between them is minimal such that the restoring force by the suspension spring structure can be easily adapted to be enough to pull the elements apart after contact. The restoring force of the beams can thus be arranged to appear practically rigid in normal overload situations.

In case motion of the rotor frame 204 is larger, the beams bend, and the frame protrusions 216 eventually come into contact with the rotor frame 204. The spring constant of the beams in a first motion limiter stage can be adapted to provide a restoring force large enough to overcome the adhesive force between the contacting surfaces in the second impact element, and pull the rotor frame back to motion after contact. The two-staged motion limiter mechanism is important especially in directions where the rotor is intended to move (suspended to have a degree of freedom), for which the restoring forces provided by the supporting spring structures are very low. The combination of the differently optimized motion limiter stages can be implemented in a minimal surface area, and in combination they provide efficient recovery after a variety of operational disturbances.

The second gap 218 between the shield frame 206 and the rotor frame 204 can be kept very small, which enables efficient gas damping in the structure. While the rotor frame 204 and the shield frame 206 are in the same potential, possible contact via the motion limiter structures of the second motion limiter stage does not short-circuit the elements. The shield frame 206 eliminates the effect of internal electromagnetic or electrostatic fields to the motion of the rotor frame 204, and at the same time enables efficient motion limiting means. The element frame 220 electrically shields the inner elements it circumscribes from external electrical disturbances.

Figure 3:
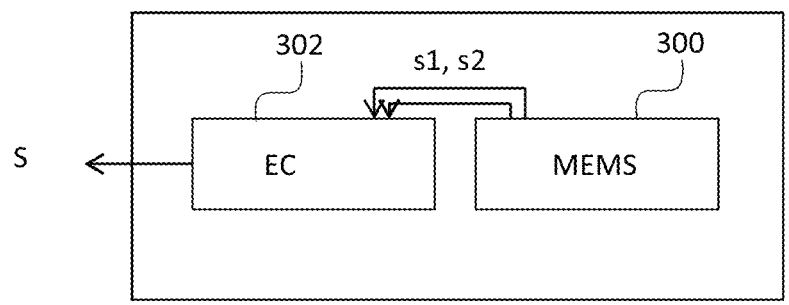
FIG. 3 illustrates elements of a microelectromechanical device that includes the microelectromechanical structure.

FIG. 3 schematically illustrates principles of an exemplary microelectromechanical device that includes the microelectromechanical structure described with FIGS. 1 and 2. The microelectromechanical device may include a first part 300 and a second part 302. The first part 300 may include mechanical elements, including the microelectromechanical structure. The second part 302 may include an electrical circuit that is connected to input electrical signals from the microelectromechanical structure. As shown in FIG. 3, one or more signals s1, s2 created within the first part may be input to the electrical circuit of the second part 302. The one or more signals s1, s2 input to the electrical circuit may be used to produce a signal S representing a measurement result of the inertial sensor.

The microelectromechanical device may be included in a combined sensor element that includes a variety of sensor elements, a wired or mobile computing, gaming or communication device, a measurement device, a rendering device, or a vehicle function control unit, to name a few.

It is apparent to a person skilled in the art that as technology advances, the basic idea of the invention can be implemented in various ways. The invention and its embodiments are therefore not restricted to the above examples, but they may vary within the scope of the claims.

The invention claimed is:

1. A microelectromechanical structure, comprising:
a first capacitive detection element, a first frame, and a second frame patterned into a material layer of the microelectromechanical structure; wherein
the first capacitive detection element includes a stator and a rotor, wherein the stator is anchored to a support to form a stationary electrode, and the rotor is suspended to a support to form a mobile electrode;
the rotor has a degree in freedom for translation in a first direction that is parallel to the material layer of the microelectromechanical structure;
the stationary electrode and the mobile electrode form a capacitor, capacitance of which is changed by motion of the mobile electrode in the first direction;
the first frame is anchored to the support and circumscribes the stator and the rotor of the first capacitive detection element in the material layer of the microelectromechanical structure;
the second frame is anchored to the support and circumscribes the stator and the rotor of the first capacitive detection element in the material layer of the microelectromechanical structure between the first capacitive detection element and the first frame;
the second frame is electrically isolated from the first frame; and
the rotor and the second frame are galvanically coupled to have a same electric potential.

2. The microelectromechanical structure of claim 1, further comprising one or more second capacitive detection elements, each circumscribed by a dedicated second frame, wherein the first frame circumscribes all capacitive detection elements in the microelectromechanical structure.

3. The microelectromechanical structure of claim 1, wherein the microelectromechanical structure includes at least one second capacitive detection element, and wherein the rotor of the second capacitive detection element is suspended to have a degree in freedom for translation in a direction that is perpendicular to the first direction.

4. The micro electromechanical structure of claim 1, wherein the second frame includes at least one impact element of the motion limiter structure.

5. The microelectromechanical structure of claim 1, further comprising at least two impact elements configured to provide successively activated motion limiter stages within the element gap.

6. The microelectromechanical structure of claim 5, wherein the at least two impact elements include:
a first impact element induced into contact by closing of a first limiter gap in response to displacement of the rotor in a specific direction, the first limiter gap being smaller than the element gap in the specific direction; and
a second impact element induced into contact by closing of the element gap in response to displacement of the capacitive detection element in the specific direction.

7. The microelectromechanical structure of claim 6, wherein the first impact element includes a flexural element.

8. The microelectromechanical structure of claim 7, wherein the flexural element is configured to provide a spring constant in the specific direction, the spring constant being configured to provide a restoring force greater than adhesive force of contact in the second impact element.

9. The microelectromechanical structure of claim 1, wherein the capacitive detection element includes a comb structure that comprises a plurality of comb bars that are disposed in parallel with, and adjacent to each other, wherein a comb gap is a distance between each of the plurality of comb bars, and wherein a width of the element gap is 0.5 to 5 times the width of the comb gap.

10. A microelectromechanical device, comprising the microelectromechanical structure of claim 1.

11. The microelectromechanical structure of claim 1, wherein the microelectromechanical structure includes a motion limiter structure activated by closing of an element gap in the material layer of the microelectromechanical structure between the rotor and the second frame that are in the same electric potential.

* * * * *